United States Patent
Rotondaro et al.

(10) Patent No.: US 6,642,094 B2
(45) Date of Patent: Nov. 4, 2003

(54) COMPLEMENTARY TRANSISTORS HAVING RESPECTIVE GATES FORMED FROM A METAL AND A CORRESPONDING METAL-SILICIDE

(75) Inventors: Antonio L. P. Rotondaro, Dallas, TX (US); Mark R. Visokay, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/998,068

(22) Filed: Nov. 30, 2001

(65) Prior Publication Data

US 2002/0076886 A1 Jun. 20, 2002

Related U.S. Application Data

(60) Provisional application No. 60/250,233, filed on Nov. 30, 2000.

(51) Int. Cl.$^7$ .......................................... H01L 21/8238
(52) U.S. Cl. .................. 438/199; 438/682; 438/686
(58) Field of Search ........................ 438/199, 682, 438/686

(56) References Cited

U.S. PATENT DOCUMENTS

| 5,162,884 | A | * | 11/1992 | Liou et al. | 257/384 |
| 5,241,193 | A | * | 8/1993 | Pfiester et al. | 257/67 |
| 5,572,047 | A | * | 11/1996 | Hiroki et al. | 257/72 |
| 6,027,961 | A | * | 2/2000 | Maiti et al. | 438/199 |
| 6,087,236 | A | * | 7/2000 | Chau et al. | 438/301 |
| 6,365,445 | B1 | * | 4/2002 | Yu | 438/149 |
| 6,475,908 | B1 | * | 11/2002 | Lin et al. | 438/659 |
| 6,506,642 | B1 | * | 1/2003 | Luning et al. | 438/231 |

* cited by examiner

*Primary Examiner*—Michael S. Lebentritt
*Assistant Examiner*—Pho Luu
(74) *Attorney, Agent, or Firm*—Peter K. McLarty; W. James Brady, III; Frederick J. Telecky, Jr.

(57) ABSTRACT

A method of forming a first and second transistor. The method provides a semiconductor surface (20). Th method also forms a gate dielectric (30) adjacent the semiconductor surface. Further, the method forms a first transistor gate electrode ($90_2$) with a metal portion ($40_2$) in a fixed relationship with respect to the gate dielectric. Still further, the method forms a second transistor gate electrode ($90_1$) with a silicide ($70_1$) of the metal portion in a fixed relationship with respect to the gate dielectric.

13 Claims, 2 Drawing Sheets

COMPLEMENTARY TRANSISTORS HAVING RESPECTIVE GATES FORMED FROM A METAL AND A CORRESPONDING METAL-SILICIDE

This application claims priority under 35 USC §119(e)(1) of provisional application Ser. No. 60/250,233, filed Nov. 30, 2000.

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to semiconductor transistor fabrication and are more particularly directed to complementary transistors.

Integrated circuit technology continues to advance at a rapid pace, with many circuit technologies being implemented using semiconductor fabrication processes. With the advancement of semiconductor circuit fabrication, consideration is given to various aspects, including maximizing efficiency, lowering manufacturing cost, and increasing performance. With these goals in mind, one area relating to the preferred embodiments is the continuing trend of reducing the thickness of the transistor gate dielectrics. For example, in the past the gate dielectric layer thickness was on the order of 100 Angstroms, but more recently that thickness has reduced considerably with a more current goal being on the order of 20 Angstroms. Indeed, this goal will strive for even thinner gate dielectric layers in the foreseeable future. This goal reduces device size and facilitates improved device performance.

While the above demonstrates the desirability and trend toward thinner gate dielectrics, such an approach also provides a considerable drawback. Specifically, overlying the thin gate dielectric is a polycrystalline silicon ("polysilicon") gate layer, and it is known in the art that polysilicon naturally includes a depletion region at the interface between the polysilicon gate and the gate dielectric. Typically, the depletion region manifests itself as providing the electrical equivalent of approximately a 3 Angstrom thick insulator and, as such, the region in effect provides an insulating effect rather than a conducting effect as would be present in the remainder of the polysilicon gate conductor. Using the preceding numeric example, therefore, for a 100 Angstrom thick gate dielectric, then the overlying effective 3 Angstrom thick polysilicon depletion region may be thought to effectively increase the overall insulation between the gate and the underlying transistor channel from 100 Angstroms to 103 Angstroms, that is, the effect of the depletion region affects the insulating thickness by three percent—as such, for previous thicker gate insulators the effect of the polysilicon depletion region may be considered to have a negligible impact on the gate dielectric. In contrast, however, for a 20 Angstrom thick gate dielectric, then the polysilicon gate conductor depletion region may be thought to increase the gate insulator to 23 Angstroms, thereby representing an increase on the order of 15 percent. This increased percentage significantly reduces the benefits otherwise provided by the thinner gate dielectric.

By way of further background, one approach in general to avoiding the depletion region phenomenon of polysilicon transistor gates is to use metal as an alternative material for the transistor gate since metal does not present a considerable depletion region, if any. Prior to the more recent use of polysilicon gates, metal gates were fairly common. The present inventors note, however, a previously identified drawback of such metal gates, which indeed led to the avoidance of such metals in contemporary devices. Specifically, each metal has a corresponding so-called work function, and in the transistor art each transistor also has a corresponding preferred value for a work function of the gate electrode. However, the desired work function value differs for different transistor types. For example, based on present day threshold voltage channel doping, a p-channel MOS transistor ("PMOS") is optimized when the gate electrode has a work function on the order of 5 eV while an n-channel MOS transistor ("NMOS") is optimized when the gate electrode has a work function on the order of 4 eV. The problem with previously-used metal gates arose with the development of CMOS circuits which, by definition, include both PMOS and NMOS transistors. Specifically, because a metal gate provides only a single work function, then it could not be selected to provide the two different desired work functions of the PMOS and NMOS devices. Instead, at best a metal could be selected to be between the desired work function of a PMOS and an NMOS transistor, which is sometimes referred to as the "midgap" between these devices (i.e., on the order of 4.5 eV for the preceding examples). This inability to match different work functions led to the use of polysilicon gates whereby the polysilicon gates of the NMOS devices could be doped in a first manner in view of the desired work function for NMOS transistors and the polysilicon gates of the PMOS devices could be doped in a second manner in view of the desired work function for PMOS transistors.

In view of the above, there arises a need to address the limitations and drawbacks of the prior art, as is achieved by the preferred embodiments described below.

BRIEF SUMMARY OF THE INVENTION

In the preferred embodiment, there is a method of forming a first and second transistor. The method provides a semiconductor surface. The method also forms a gate dielectric adjacent the semiconductor surface. Further, the method forms a first transistor gate electrode comprising a metal portion in a fixed relationship with respect to the gate dielectric. Still further, the method forms a second transistor gate electrode comprising a silicide of the metal portion in a fixed relationship with respect to the gate dielectric. Other aspects are also disclosed and claimed.

DETAILED DESCRIPTION OF THE INVENTION

Figure 1:
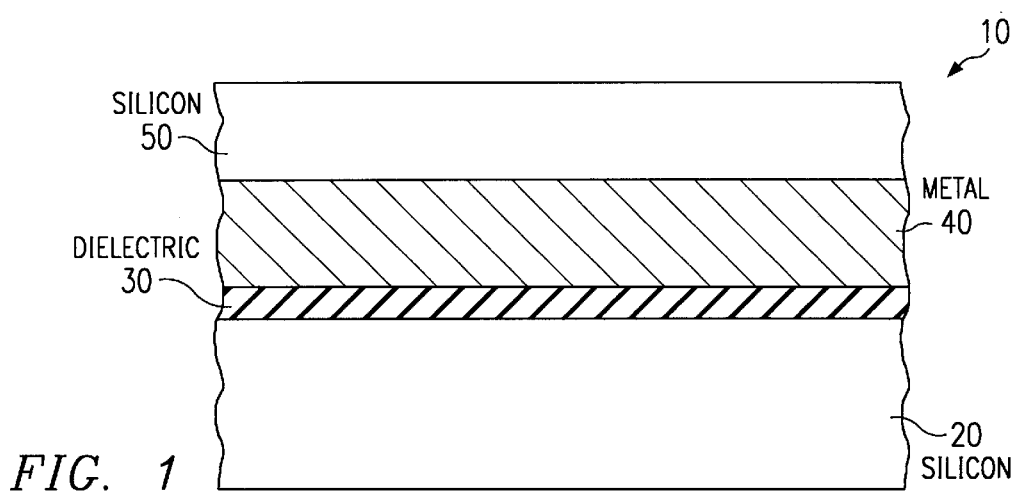
FIG. 1 illustrates a cross-sectional view of a semiconductor structure according to the preferred embodiment after a first set of fabrication steps.

FIG. 1 illustrates a cross-sectional view of a semiconductor structure shown generally at 10. By way of introduction, structure 10 represents a first set of steps in accordance with the preferred embodiment, with the following discussion and additional Figures illustrating various additional steps used to form complementary PMOS and NMOS transistors. Moreover, while the set of transistors ultimately illustrate depict only a single PMOS and a single NMOS transistor, one skilled in the art will readily appreciate that the present inventive teachings may apply to numerous transistors of both types in a circuit. Also by way of introduction, note that the various layers shown in the cross-section of FIG. 1 and later Figures are not shown to scale to simplify the following discussion and because varying thickness may be employed as may be ascertained by one skilled in the art and also in view of various guidance given below.

Turning to FIG. 1 in greater detail, the preferred embodiment includes a semiconductor surface formed preferably by a substrate 20, where substrate 20 is preferably formed from silicon. A dielectric layer 30 is formed over substrate 20, where the material for dielectric layer 30 is preferably chosen so that portions of dielectric layer 30 later function as gate dielectrics for complementary PMOS and NMOS transistors. A metal layer 40 is formed over dielectric layer 30, where in the preferred embodiment metal layer 40 is formed from cobalt. Finally, a silicon layer 50 is formed over metal layer 40. In the preferred embodiment, silicon layer 50 may be polysilicon or amorphous silicon. As between these alternatives, preferably the selection is such that, at the stage in the process represented by FIG. 1, the chosen silicon in layer 50 does not react with the underlying metal layer 40. Given this consideration, in most applications amorphous silicon is more preferred because it may be formed over metal layer 40 at lower temperatures than that typically required to form polysilicon. For example, an amorphous silicon layer 50 may be formed at temperatures lower than 500° C. Note also that the manner in which silicon layer 50 is formed may be according to various alternatives, again where the choice of such an alternative is preferably directed to ensuring no reaction between silicon layer 50 and metal layer 40. For example, a sputter technique may be used because it may be carried out at low temperatures such as room temperature, although from a manufacturing standpoint such a technique may prove relatively complex. As an alternative, a plasma-enhanced chemical vapor deposition ("CVD") may be used because it too uses a relatively low temperature, where this temperature may be above room temperature yet the CVD may prove more easily implemented as compared to the sputter technique. Lastly, a thermal CVD process may be used, but caution should be taken to ensure that any temperature constraint of that process does not cause a reaction between metal layer 40 and silicon layer 50.

Figure 2:
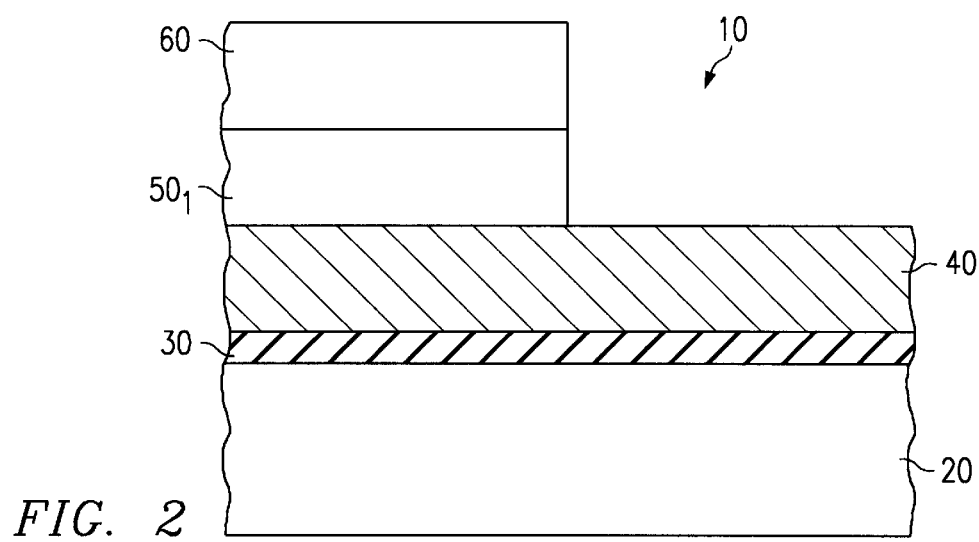
FIG. 2 illustrates a cross-sectional view of the structure from FIG. 1 after additional processing steps.

FIG. 2 illustrates a cross-sectional view of structure 10 from FIG. 1 after additional processing steps. In FIG. 2, a portion of silicon layer 50 is removed, thereby leaving a remaining portion 50$_1$ of silicon. In the preferred embodiment, this selective removal is achieved by first forming a photoresist layer over silicon layer 50 and then patterning that photoresist layer to leave a photoresist portion 60 of the photoresist layer as shown in FIG. 2. Thereafter, an etch selective to the metal of metal layer 40 is performed, that is, one which stops when it reaches metal layer 40. In the preferred embodiment, therefore, the silicon etch performed in connection with FIG. 2 is selective to cobalt. The selective etch removes the area of silicon layer 50 that is not covered by photoresist portion 60, thereby leaving a remaining silicon portion 50$_1$ under photoresist portion 60. In the preferred embodiment the silicon etch is a dry process, although alternatively a wet etch may be implemented because the result of the etch does not provide critical dimensions in that a later etch is performed to provide various device boundaries as further appreciated below.

Figure 3:
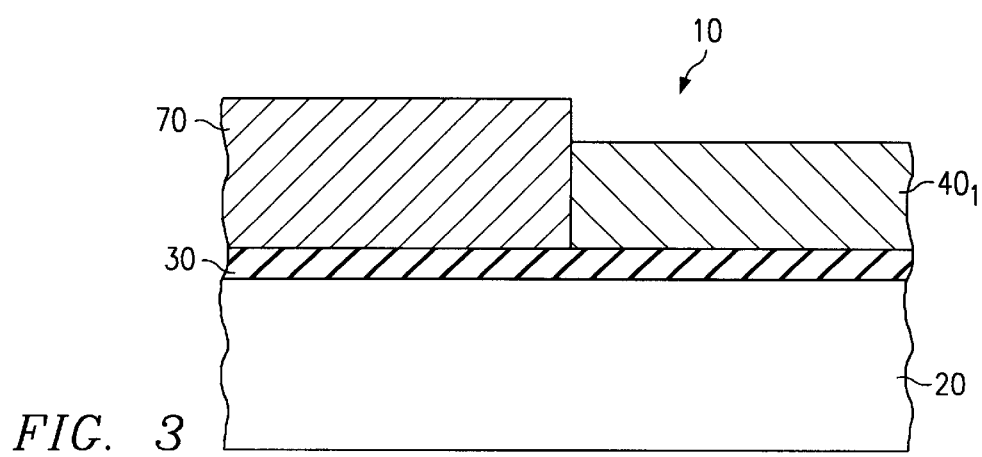
FIG. 3 illustrates a cross-sectional view of the structure from FIG. 2 after additional processing steps.

FIG. 3 illustrates a cross-sectional view of structure 10 from FIG. 2 after two additional processing steps, and each of these steps is discussed below.

As a first step reflected in FIG. 3, photoresist portion 60 (see FIG. 2) is removed, and this removal step may be accomplished in various manners. For example, either an oxygen or hydrogen ash may be used, although an oxygen approach is less favored because it may pose a risk of oxidation of the metal (e.g., cobalt) in the exposed area of metal layer 40. As still another example, a solvent may be chosen, in which case the particular solvent should be selected so as not to damage either the silicon in portion 50$_1$ underlying photoresist portion 60 or the metal in the exposed area of metal layer 40. In any event, once photoresist portion 60 is removed, silicon portion 50$_1$ is exposed.

As a second step reflected in FIG. 3, an anneal step is performed preferably after photoresist portion 60 is removed. The anneal step may be achieved using various temperatures and times, and by way of example a rapid thermal processing ("RTP") operation may be used whereby a relatively short anneal is performed at temperatures of 500° C. or greater. In the preferred embodiment, the anneal causes silicon portion 50$_1$ to react with the aligned portion of the metal underlying it in metal layer 40, and this reaction thereby forms a metal silicide portion 70. The actual temperature used in the anneal step may determine the precise type of silicide in silicide portion 70. For example, at temperatures on the order of 500 to 600° C. and using the preferred metal of cobalt for metal layer 40, then silicide portion 70 is likely to form a cobalt monosilicide. As another example, at temperatures on the order of 700 to 800° C. and again using the preferred metal of cobalt for metal layer 40, then silicide portion 70 is likely to form a cobalt disilicide. Indeed, in various applications, the cobalt disilicide result may be desirable because it has a lower resistivity as compared to cobalt monosilicide. In addition, note also from FIG. 2 and the result in FIG. 3 that the thickness of silicon layer 50, which determines the thickness of silicon portion 50$_1$, also may affect the extent to which the metal in metal layer 40 is converted to a silicide. Further in this regard, in an alternative method approach, the thickness of silicon layer 50 may be selected so as to achieve a desired extent and thickness of silicide in silicide portion 70. However, thickness control may prove difficult, but in view of this added complexity still another approach within the inventive scope is to choose the thickness of silicon layer 50 to be considerably large with the goal that not all of the silicon will be consumed during the anneal step. Using this approach, then after the anneal a portion of structure 10 is etched, such as through use of a blanket silicon etch, so as to remove the unconsumed silicon. With the unconsumed silicon removed, silicide portion 70 remains as shown in FIG. 3. Lastly, note that the preferred anneal step does not materially affect a portion 40$_1$ of metal layer 40 to the right of FIG. 3 because it was not in contact with any silicon as shown in FIG. 2. Thus, portion 40$_1$ remains as the material originally used for metal layer 40 (e.g., cobalt).

Figure 4A:
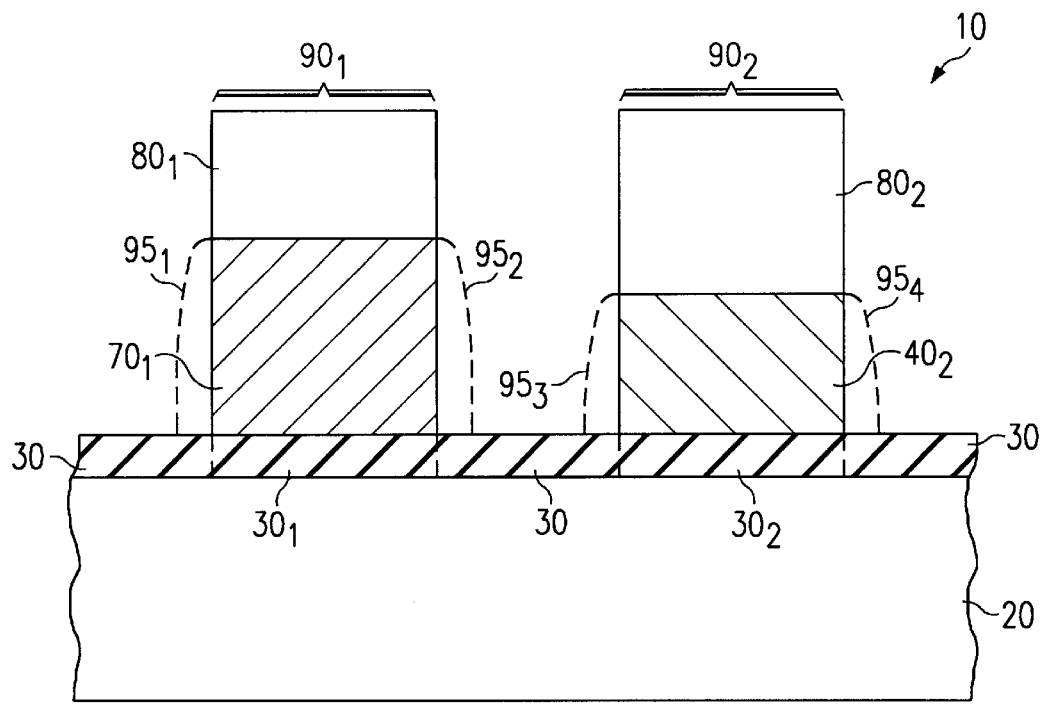
FIG. 4a illustrates a cross-sectional view of the structure from FIG. 3 after additional processing steps.

FIG. 4a illustrates a cross-sectional view of structure 10 from FIG. 3 after additional processing steps. First, a photoresist layer is formed and patterned over structure 10 to thereby form two photoresist portions 80$_1$ and 80$_2$ overlying the metal silicide and metal materials, respectively, underlying those portions. Second, an etch is performed down to dielectric layer 30. The resulting structures following this etch are therefore shown in FIG. 4a and include two gate electrodes 90$_1$ and 90$_2$. With respect to gate electrode 90$_1$, it includes a silicide portion 70$_1$ which remains from the etch of silicide layer 70, and a portion of dielectric layer 30 separates silicide portion 70$_1$ from substrate 20 and, thus, this portion serves as a gate insulator 30$_1$. With respect to gate electrode 90$_2$, it includes a metal portion 40$_2$ which remains from the etch of metal portion 40$_1$, and a portion of dielectric layer 30 separates metal portion 40$_2$ from substrate 20 and, thus, this portion serves as a gate insulator 30$_2$.

Various additional observations now may be made with respect to the resulting structure in FIG. 4a. As a first observation, gate electrodes 90$_1$ and 90$_2$ provide structures from which two different transistors may be formed, where the gate of each respective transistor has a different work function because each electrode includes a different material. For example, an NMOS transistor may be formed with respect to gate electrode 90$_1$ which thereby implements a gate having the work function of the metal silicide of silicide portion 70$_1$, while a PMOS transistor may be formed with respect to electrode 90$_2$ which thereby implements a gate having the work function of the metal of metal portion 40$_2$. To further illustrate these aspects and as a second observation, photoresist portions 80$_1$ and 80$_2$ may be thereafter removed and insulating sidewalls may be formed with respect to the gate materials and their underlying gate insulators; such sidewalls 95$_1$ through 95$_4$ are shown with dashed lines in FIG. 4a. Additionally, various additional transistor aspects as readily ascertainable by one skilled in the art are not shown, but may be implemented with respect to the gate electrodes, including but not limited to n-wells or p-wells, source/drain regions, channel implants, isolation oxides, and the like. Moreover, some of these regions may be formed prior to the formation of the gate electrodes, such as the formation of isolation regions to later define boundaries for source/drain implants and a well of a given conductivity type such as an n-well for a PMOS transistor, while others of these regions may be formed after the formation of the gate electrodes, such as the formation of the source/drain regions. As a final observation, the preferred methodology as illustrated in FIGS. 1 through 4a demonstrates still another benefit arising with respect to the formation of gate insulators 30$_1$ and 30$_2$. Specifically, from the above, note that the etch down to dielectric layer 30 does not reach those portions of that layer that serve as gate insulators 30$_1$ and 30$_2$. Thus, the material properties of these gate insulators 30$_1$ and 30$_2$ are not affected by a direct exposure of these regions to the etch chemistry.

Figure 4B:
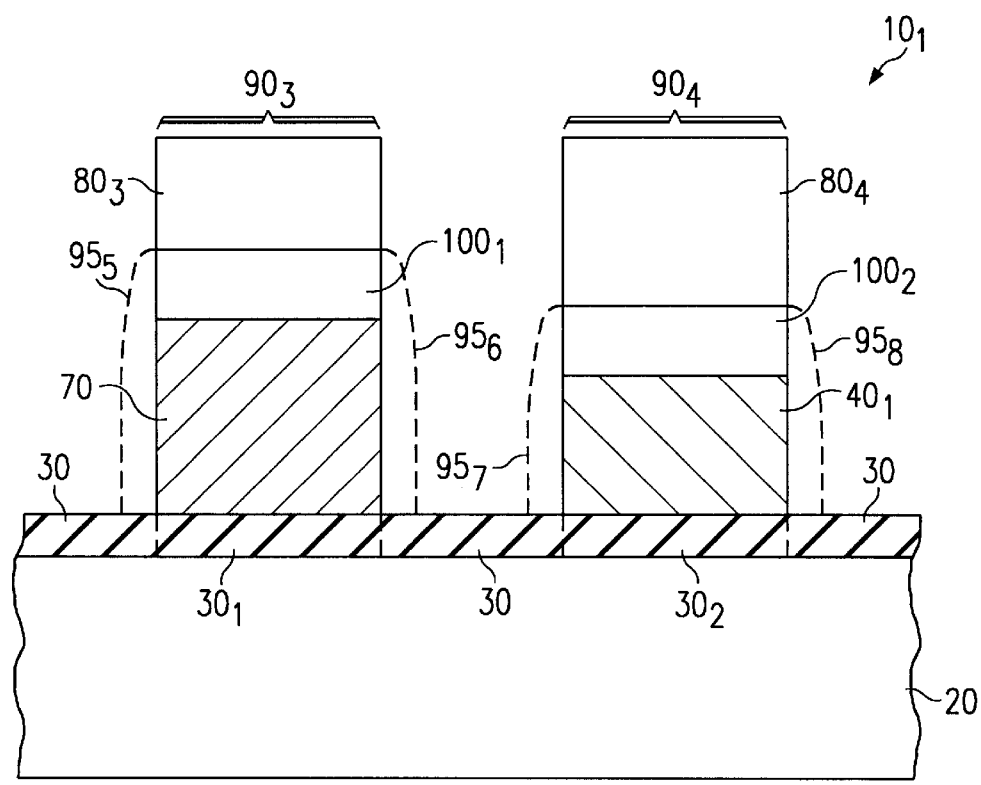
FIG. 4b illustrates a cross-sectional view of the structure from FIG. 3 after an alternative set of additional processing steps.

FIG. 4b illustrates a cross-sectional view of an alternative structure 10' which is created with alternative processing steps following FIG. 3. Structure 10' shares various attributes with structure 10 of FIG. 4a and, thus, like reference numerals are used in FIG. 4b with respect to these attributes. As an alteration, however, prior to forming a photoresist layer and photoresist portions 80$_3$ and 80$_4$ from that layer, an additional clad layer is formed, and photoresist portions 80$_3$ and 80$_4$ are then formed and an etch down to dielectric layer 30 is performed; as a result, two gate electrodes 90$_3$ and 90$_4$ are formed, but each gate electrode includes an additional clad layer portion 100$_1$ and 100$_2$, respectively. The inclusion of the additional clad layer and the resulting portions 100$_1$ and 100$_2$ may be used for various purposes. For example, if the approach of FIG. 4a would result in gate electrodes of an insufficient thickness, then the use of an additional clad layer to form portions 100$_1$ and 100$_2$ thereby increases the height of gate electrodes 90$_3$ and 90$_4$ as opposed to gate electrodes 90$_1$ and 90$_2$. As another example, if a lower sheet resistance is desired than that achieved by the approach of FIG. 4a, then the FIG. 4b approach may be implemented where the material for the clad layer forming portions 100$_1$ and 100$_2$ is selected to alter the sheet resistance. For example, various materials may be considered to reduce the overall sheet resistance of portions 100$_1$ and 100$_2$, such as various conductive layers including metals, and indeed preferably refractory metals, such as tungsten, tantalum, titanium, tungsten nitride, tantalum nitride, and titanium nitride, and also others as may be ascertained by one skilled in the art. In any event, once the etch to form gate electrodes 90$_3$ and 90$_4$ is complete, photoresist portions 80$_1$ and 80$_2$ may be removed and insulating sidewalls 95$_5$ through 95$_8$ may be formed, as shown with dashed lines in FIG. 4b. Lastly, various other benefits realized by structure 10 of FIG. 4a are also realized by structure 10' of FIG. 4b.

From the above, it may be appreciated that the above embodiments provide a set of transistor gates where one gate is formed from a metal and the other gate is formed from a corresponding metal-silicide. In the preferred embodiment, the metal is cobalt while the metal-silicide is either cobalt monosilicide or cobalt disilicide. Given these resulting structures, the preferred embodiment produces various benefits. For example, each transistor gate has a different work function, and indeed the metal gate structure proves useful as a PMOS gate electrode while the metal-silicide gate structure proves useful as an NMOS gate electrode. As another example, transistors may be formed using these resulting structures along with relatively thin gate dielectrics, and the overlying metal or metal-silicide gate will not include a substantial depletion region as is the case for contemporary polysilicon gate transistors. As still another example, while cobalt has been shown as a preferred metal, other metals may be used. As yet another example, the preferred embodiment contemplates additional variations described above. Thus, all of these examples further demonstrate that while the present embodiments have been described in detail, various substitutions, modifications or alterations could be made to the descriptions set forth above without departing from the inventive scope which is defined by the following claims.

What is claimed is:

1. A method of forming a plurality of transistors including a first and second transistor, comprising the steps of:
   providing a semiconductor surface;
   forming a gate dielectric over the semiconductor surface;
   forming a metal layer over said gate dielectric;
   forming a first material layer over a first region of said metal layer wherein said first material layer comprises silicon;
   forming a first transistor gate electrode from a portion of said metal layer; and
   forming a second transistor gate electrode by annealing said metal layer and said first material layer to form a metal silicide.

2. The method of claim 1, wherein the metal layer comprises cobalt.

3. The method of claim 2, wherein the metal silicide comprises cobalt monosilicide.

4. The method of claim 2, wherein the metal silicide comprises cobalt disilicide.

5. The method of claim 1, wherein the annealing step comprises annealing said metal layer and aid first material layer at a temperature sufficient to convert said metal layer and said first material layer into a metal monosilicide.

6. The method of claim 1, wherein the annealing step comprises annealing said metal layer and aid first material layer at a temperature sufficient to convert said metal layer and said first material layer into a metal disilicide.

7. A method of forming a plurality of transistors including a first and second transistor with differing gate electrodes, comprising the steps of:

providing a semiconductor surface;

forming a gate dielectric ver the semiconductor surface;

forming a first metal layer over said gate dielectric;

forming a first material layer over a first region of said first metal layer wherein said first material layer comprises silicon;

annealing said first material layer and said underlying first metal layer to form a metal silicide;

forming a second metal layer over said first metal layer and said metal silicide layer;

forming a first transistor gate electrode comprising a portion of said first metal layer and said second metal layer; an forming a second transistor gate electrode comprising a portion of said metal silicide and said second metal layer.

8. The method of claim 7, wherein the first metal layer comprises cobalt.

9. The method of claim 8, wherein the metal silicide comprises cobalt monosilicide.

10. The method of claim 8, wherein the metal suicide comprises cobalt disilicide.

11. The method of claim 7, wherein said second metal layer is selected from a group consisting tungsten, tantalum, titanium, tungsten nitride, tantalum nitride, and titanium nitride.

12. The method of claim 7, wherein the annealing step comprises annealing said metal layer and said first material layer at a temperature sufficient to convert said metal layer and said first material layer into a metal monosilicide.

13. The method of claim 7, wherein the annealing step comprises annealing said metal layer and said first material layer at a temperature sufficient to convert said metal layer and said first material layer into a metal disilicide.

* * * * *